United States Patent
Lee (10) Patent No.: US 7,893,702 B2
(45) Date of Patent: Feb. 22, 2011

(54) APPARATUS FOR TESTING SEMICONDUCTOR DEVICE PACKAGE AND MULTILEVEL PUSHER THEREOF

(75) Inventor: Young-Chul Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 195 days.

(21) Appl. No.: 12/319,329

(22) Filed: Jan. 6, 2009

(65) Prior Publication Data
US 2009/0174424 A1 Jul. 9, 2009

(30) Foreign Application Priority Data
Jan. 7, 2008 (KR) ............... 10-2008-0001594

(51) Int. Cl.
*G01R 31/20* (2006.01)
(52) U.S. Cl. ................................ 324/754.08
(58) Field of Classification Search ............... 324/765, 324/760, 158.1, 754, 761–762, 758, 754.08, 324/745.13–754.14; 414/403; 438/14–18
See application file for complete search history.

(56) References Cited

U.S. PATENT DOCUMENTS 5,447,448 A    9/1995  Noriyuki
6,030,858 A    2/2000  Cha et al.
6,456,062 B2 * 9/2002  Yamashita et al. ........ 324/158.1
6,724,206 B2 * 4/2004  Arakawa et al. ............ 324/755
7,232,328 B2   6/2007  Saito

FOREIGN PATENT DOCUMENTS

| JP | 6018613 | 1/1994 |
| JP | 07046625 | 2/1995 |
| JP | 2002-343518 | 11/2002 |
| JP | 2005-172576 | 6/2005 |
| KR | 100242393 | 11/1999 |

* cited by examiner

*Primary Examiner*—Ha Tran T Nguyen
*Assistant Examiner*—Tung X Nguyen
(74) *Attorney, Agent, or Firm*—Mills & Onello, LLP (57) ABSTRACT

A semiconductor package testing apparatus comprises a test substrate that electrically tests a semiconductor package chip; a socket having an electrical contact between the test substrate and the semiconductor package; an insert block inserted into the socket, wherein the semiconductor package is mounted to the insert block; and a pusher that brings the socket into contact with the semiconductor package by compressing an upper part of the semiconductor package, wherein the pusher is multilevel-controlled to compress the semiconductor package by a predefined pressure according to a thickness of the semiconductor package.

19 Claims, 7 Drawing Sheets

APPARATUS FOR TESTING SEMICONDUCTOR DEVICE PACKAGE AND MULTILEVEL PUSHER THEREOF

CROSS-REFERENCE TO RELATED APPLICATIONS

This application claims priority under 35 U.S.C. §119 from Korean Patent Application 10-2008-0001594, filed on Jan. 7, 2008, the contents of which are incorporated by reference in its entirety for all purposes as if fully set forth herein.

BACKGROUND

1. Field of the Invention

The present invention relates to a semiconductor package testing apparatus, and more particularly, to a semiconductor package testing apparatus and a multilevel pusher thereof, for performing an electrical characteristic test on semiconductor packages.

2. Description of the Related Art

Semiconductor chips separated from a wafer after a wafer process can be manufactured into a semiconductor package by an assembling step. Subsequently, various tests are performed to check the reliability of the semiconductor package, as well as products resulting from the formation of the package.

A general test includes an electrical characteristic test that tests electrical characteristics and defects of semiconductor chips, and a burn-in test that determines the integrity of semiconductor chips and defects occurring thereof under severe conditions, for example, when an abnormally high temperature, voltage, current, etc. is applied, as compared to a normal operating condition.

The electrical characteristic test checks for either a normal operation or short-circuit state in a semiconductor chip by bringing all input/output terminals of the semiconductor chip into contact with a test circuit substrate on which a test signal generating circuit is adapted. In the electrical characteristic test of a semiconductor package, a handler is mainly used, for example, a conventional semiconductor package testing apparatus including a handler disclosed in U.S. Pat. No. 7,232,328, incorporated herein by reference in its entirety.

A semiconductor package testing apparatus is described as follows, referring to the drawings.

Figure 1:
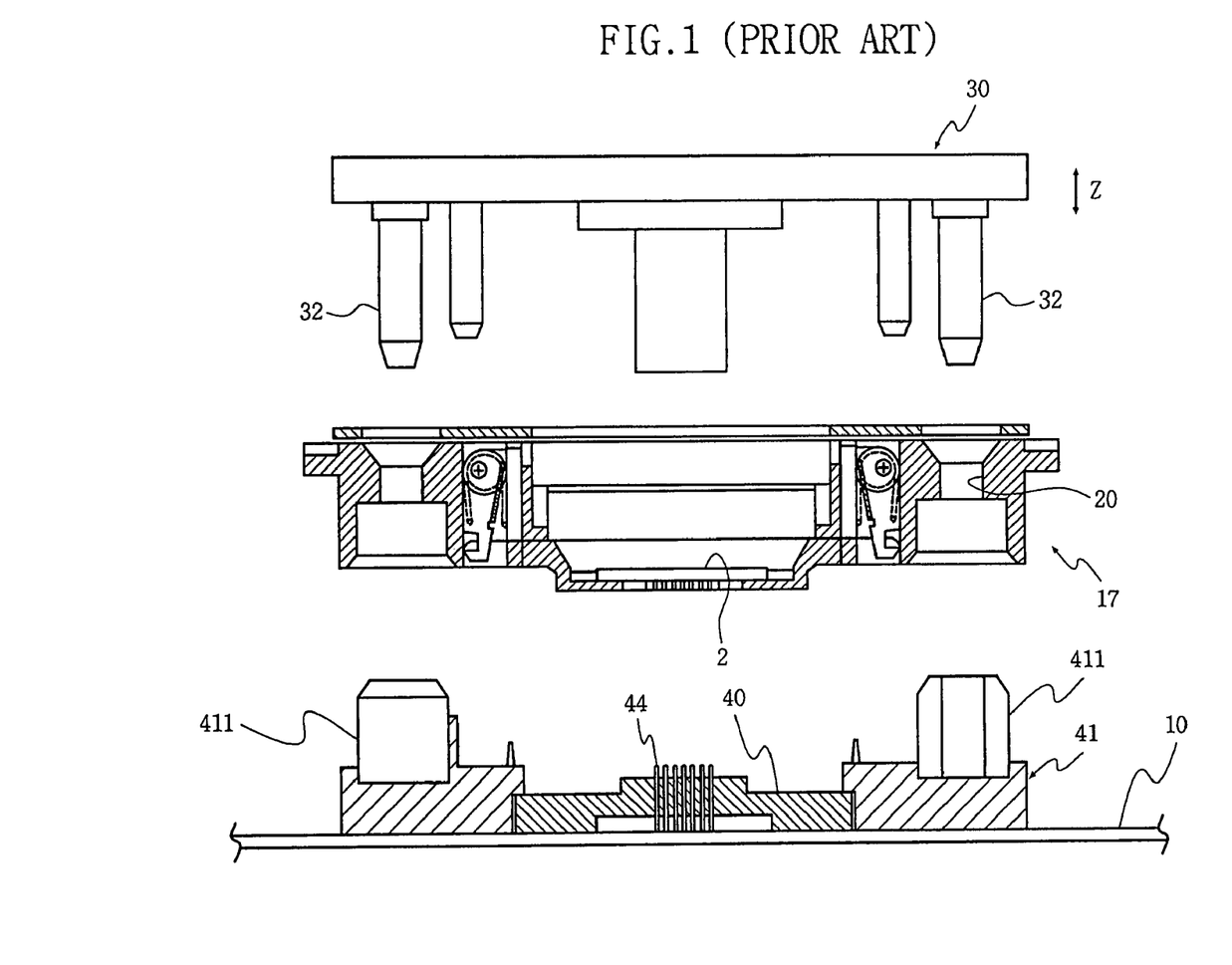
FIG. 1 is a sectional view schematically illustrating a conventional semiconductor package testing apparatus.

FIG. 1 is a sectional view schematically showing a semiconductor package testing apparatus according to conventional art.

As illustrated in FIG. 1, in a conventional semiconductor package testing apparatus, a test substrate 10 includes a test circuit, and further includes a socket 40 that is electrically coupled between the test substrate 10 and a semiconductor package 2. The test substrate 10 is positioned in a lower part of an insert block 17. The semiconductor package 2 is inserted into an insert hole of the insert block 17, and the semiconductor package is compressed by a pusher 30.

The semiconductor package 2 is electrically coupled with the test circuit through a plurality of socket terminals 44 formed in a center of the socket 40. A socket guide 41 for protecting the socket 40 surrounds the socket 40. Guide pins 32 of the pusher 30 are inserted into guide holes 20 of the insert block 17 and guide bushes 411 of the socket guide 41. In both edge parts of the socket guide 41, guide bushes 411 are formed into which guide pins 32 of the pusher 30 extending from the insert block 17 are inserted.

Thus, the insert block 17 is positioned in the periphery part above the socket 40 supported on the test circuit, and the semiconductor package 2 can be inserted into the insert hole of the insert block 17. The semiconductor package 2 is compressed by an operation in which the pusher 30 above the insert block 17 is lowered in a z-direction. In this manner, the pusher 30, the insert block 17, and the socket 40 can be aligned mutually.

At this time, when the semiconductor package 2 is inserted into the insert block 17, the semiconductor package 2 must be compressed to a predefined level. Thus, when the pusher 30 is lowered to the predefined level, or below, a contact area between a terminal of the semiconductor package 2 and the socket terminal 44 is reduced, and so reliability of electrical characteristic test decreases. Further, when the pusher 30 is lowered more than the predefined level, the socket terminal 44 may be damaged. For example, the pusher 30 can lower the semiconductor package 2 about 0.25 mm to about 0.30 mm.

Further, in the conventional semiconductor package testing apparatus, a lowered level of the pusher 30 is limited to testing a semiconductor package 2 having a specific, single thickness. Thus, operation of the pusher is limited to testing packages of that thickness.

SUMMARY

Accordingly, some embodiments of the invention provide a semiconductor package testing apparatus and a multilevel pusher thereof, which is capable of increasing productivity by applying a pusher compressing a semiconductor package to an electrical characteristic test of semiconductor package based on various thicknesses.

In an aspect, a semiconductor package testing apparatus comprises a test substrate that electrically tests a semiconductor package chip; a socket having an electrical contact between the test substrate and the semiconductor package; an insert block inserted into the socket, wherein the semiconductor package is mounted to the insert block; and a pusher that brings the socket into contact with the semiconductor package by compressing an upper part of the semiconductor package, wherein the pusher is multilevel-controlled to compress the semiconductor package by a predefined pressure according to a thickness of the semiconductor package.

In an embodiment, the pusher comprises a housing having a predefined internal space, and a rotary pusher block having a plurality of tips that compress a corresponding semiconductor package by using the tips, wherein the tips have different levels according to a thickness of the semiconductor package.

In an embodiment, the housing comprises a lower housing through which any one of a plurality of tips of the rotary pusher block pierces, and an upper housing adapted covering the rotary pusher block in an upper part of the lower housing.

In an embodiment, the lower housing comprises a base defining a lowered distance of the pusher in an edge portion thereof, and a guide pin adapted to align the socket and the insert block.

In an embodiment, the rotary pusher block has a cross shape comprising four tips, each tip having a different level according to a thickness of semiconductor package inserted into the insert block.

In an embodiment, the rotary pusher block has a Y-shape comprising three tips, each tip having a different level according to a thickness of semiconductor package inserted into the insert block.

In an embodiment, the rotary pusher block has a straight shape comprising two tips, each tip having a different level according to a thickness of semiconductor package inserted into the insert block.

In an embodiment, the pusher further comprises a rotary axis extending through a center of the housing, that rotates the rotary pusher block, and a rotation supporter for supporting the rotary axis.

In an embodiment, a plurality of springs provides elasticity to the rotation supporter inside the housing.

In an embodiment, the housing comprises a fixation hole that stops a rotation of the rotary axis while the rotary axis passes through the fixation hole, and further comprises a rotation hole larger than the fixation hole so that the rotary axis can rotate therein.

In an embodiment, the rotary axis is provided with a rotation system formed at an end part thereof.

In an embodiment, the rotation system and the fixation hole have a same or similar shape and size so as to be fastened to each other.

In an aspect, a multilevel pusher comprises a housing comprising a lower housing and an upper housing having a predefined internal space; a rotary axis that extends through a hole in a center of the housing; and a rotary pusher block about the rotary axis, and comprising a plurality of tips, each tip having a length relative to the rotary axis that is different with respect to a length of at least one of the other tips of the rotary pusher block, wherein a tip of the plurality of tips is selectable by rotating the rotary pusher block about the rotary axis within the housing, the selectable tip being exposed to the outside of the lower housing.

In an embodiment, the multilevel pusher further comprises a rotation supporter that supports the rotary axis on one side of the hole in the center of the housing, and a spring that provides elasticity in the rotation supporter opposite the rotary axis.

In an embodiment, the rotary pusher block has a cross shape comprising four tips, each tip having a different level according to a thickness of semiconductor package inserted into the insert block.

In an embodiment, the rotary axis for rotating the rotary pusher block having the cross shape is coupled to a rotation system that is at an end part of the rotary axis, the rotation system formed in a hexahedron having a square-shape sectional face.

In an embodiment, the rotary pusher block has a Y-shape comprising three tips, each tip having a different level according to a thickness of the semiconductor package inserted into the insert block.

In an embodiment, the rotary axis for rotating the rotary pusher block having the Y-shape is coupled to a rotation system that is at an end part of the rotary axis, the rotation system formed in a pentahedron having a triangle-shape sectional face.

In an embodiment, the rotary pusher block has a straight-shape comprising two tips, each tip having a different level according to a thickness of the semiconductor package inserted into the insert block.

In an embodiment, the rotary axis for rotating the rotary pusher block having the straight-shape is coupled to a rotation system that is at an end part of the rotary axis, the rotation system formed in a hexahedron having a rectangular-shape sectional face.

As described above, an electrical characteristic test for semiconductor packages with various thickness can be performed by using a multilevel pusher for compressing the semiconductor package by a uniform compression force based on the thickness of semiconductor package, thereby increasing productivity.

BRIEF DESCRIPTION OF THE DRAWINGS

The above and other features and advantages of the present invention will become more apparent to those of ordinary skill in the art by describing in detail preferred embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE EMBODIMENTS

Embodiments of the present invention now will be described more fully hereinafter with reference to FIGS. 2 to 5, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 5. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or abutting or overlapping the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

A semiconductor package testing apparatus and a multi-level pusher thereof according to an embodiment of the invention are described as follows, referring to the accompanied drawings.

Figure 2:
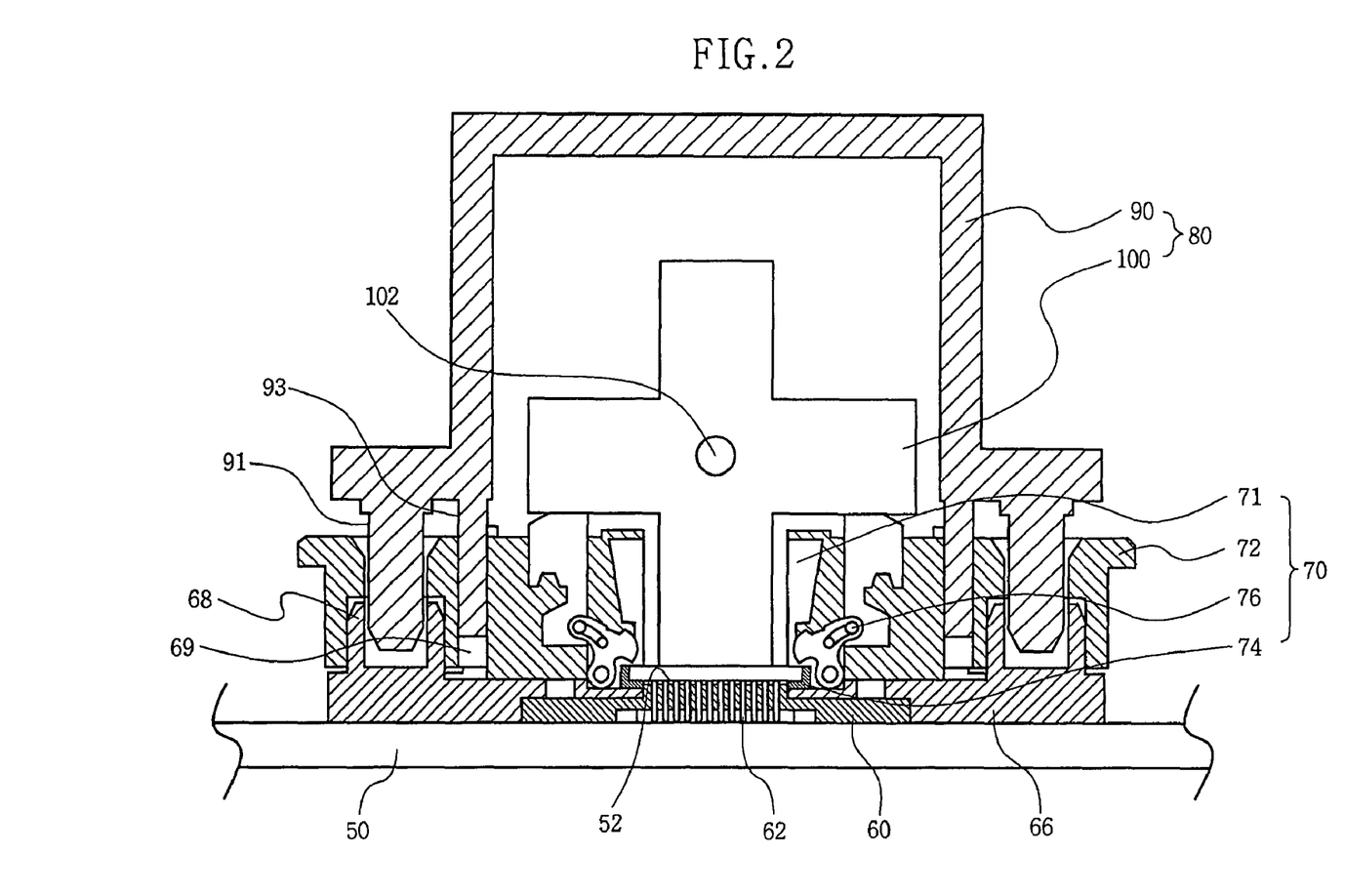
FIG. 2 is a sectional view schematically illustrating a semiconductor package testing apparatus according to embodiments of the invention.

FIG. 2 is a sectional view schematically illustrating a semiconductor package testing apparatus according to an embodiment of the invention.

As shown in FIG. 2, a semiconductor package testing apparatus includes a pusher 80 that compresses a semiconductor package 52 positioned within an insert hole 71 of an insert block 70, and is multilevel-controlled, such that the pusher 80 includes different compressed levels, depending on a thickness of the semiconductor package.

The pusher 80 compresses the semiconductor package 52 mounted on a socket 60 in the bottom of the insert hole 71. The semiconductor package 52 compressed by the pusher 80 can be electrically coupled to a test substrate 50 through the socket 60.

A test operation circuit is on the test substrate 50, and tests an electrical operation of the semiconductor package 52. Although not shown in the drawings, a test terminal exposed to the outside provides an electrical connection through the socket 60 as part of the testing of the electrical operation of the semiconductor package 52.

The socket 60 is electrically coupled to the test terminal extending from the test substrate 50, and is electrically coupled to a solder ball or lead frame of the semiconductor package. In an embodiment, the socket 60 comprises a body, which, in an embodiment, is a round body, in which a plurality of socket terminals 62 for providing an electrical connection between the test substrate 50 and the semiconductor package 52 are configured, and a socket guide 66 surrounding the round surface of the body of the socket 60. Here, at least one socket terminal of the plurality of socket terminals 62 is called a pogo-type socket pin, and electrically contacts the test terminal in a lower part thereof. Further, the solder ball or lead frame of the semiconductor package 52 is formed with a uniform elasticity to have an electrical connection when the semiconductor package 52 mounted in the insert block 70 of the upper part is compressed by a given pressure.

The socket guide 66 is adapted to align the insert block 70 and the pusher 80 mounted on the socket 60. Thus, in an edge of the socket guide 66, a guide bush 68 is adapted, which pierces an edge portion of the insert block 70 and into which a guide pin 91 formed on an edge of the pusher 80 is inserted. Further, a stopper 69 has a geometry that is adapted to communicate with a lowered level of the pusher 80 so as to stop a motion of base 93 adapted in an edge portion of the pusher 80.

The insert block 70 is provided to house the semiconductor package 52. Although not shown in the drawings, a tray on which a plurality of tray holes having an insertion of a plurality of insert blocks 70 are formed, is positioned on the test substrate 50. For example, in one tray there are formed a plurality of tray holes into which about 200 to 300 insert blocks 70 are inserted. The plurality of insert blocks 70 may be fixed to the tray in a state of respectively storing the plurality of semiconductor packages 52, and may be positioned on the test substrate 50 on which a plurality of test circuits and sockets 60 are adapted, in an electrical characteristic test process. In an embodiment, the tray can be of a type that is similar to that disclosed in U.S. Pat. No. 7,232,328, incorporated by reference above.

Also the insert block 70 comprises an insert body 72 provided with the insert hole 71 having an insertion of the semiconductor package 52, an insert stay 74 supporting the semiconductor package 52 inserted through the insert hole 71, and a clamp 76 supported by the insert stay 74, for fixing in place the semiconductor package 52 compressed by the pusher 80.

The pusher 80 is jointed with or otherwise connected to, for example, a press (not shown). The press may exert pressure onto the pusher 80 such that the semiconductor package 52 is compressed onto the socket 60. At this time, a lowered distance of the semiconductor package 52 by the pusher 80 is referred to as a contact stroke distance. In an embodiment, the contact stroke distance required generally is about 0.25 mm to about 0.3 mm.

Figure 3:
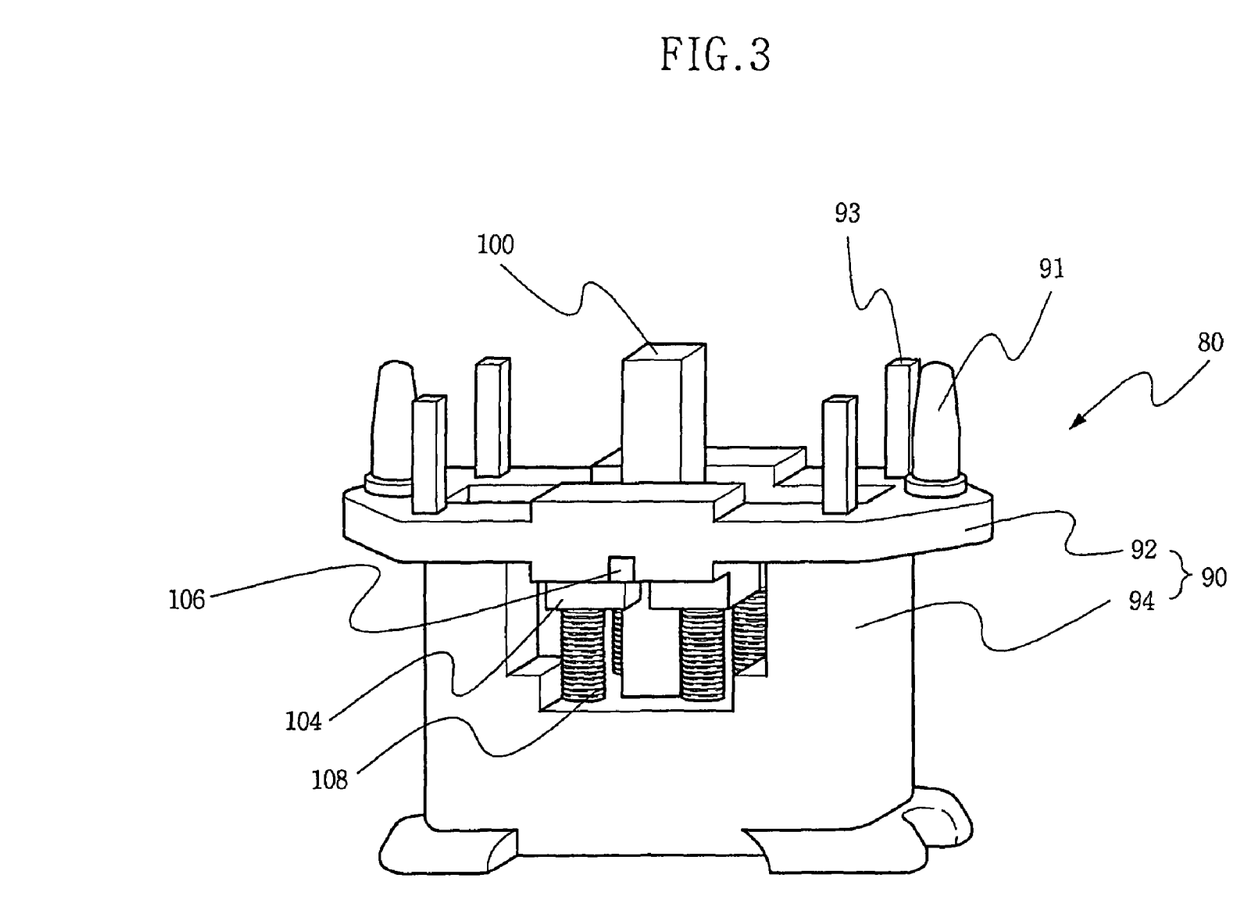
FIG. 3 is a perspective view illustrating a pusher shown in FIG. 2 according to embodiments of the invention.

FIG. 3 is a perspective view illustrating the pusher 80 of FIG. 2, and FIGS. 4A to 4C are plan views illustrating a rotary pusher block 100 shown in FIG. 3.

As shown in FIGS. 2 and 3, the pusher 80 comprises a housing 90 coupled with an end part of the press raised and lowered with a given compression force, and a rotary pusher block 100 positioned in a center part of the housing 90 so that tips of the rotary pusher block 100 (see FIGS. 4A to 4C) of different levels compress the semiconductor package 52, depending on a thickness of the semiconductor package 52. In an embodiment, each tip has a different length relative to rotary axis 102.

The housing 90 may be divided into a lower housing 92 in which a base 93 and a guide pin 91 adapted to define a lowered distance of the pusher 80 and align the socket 60 and the insert block 70 are installed in an edge thereof, and an upper housing 94 provided to cover the rotary pusher block 100 in an upper part of the lower housing 92.

As described above, the guide pin 91 protruding from an edge part of the lower housing 92 is combined with the guide bush 68 formed in an edge part of the socket guide 66, thereby aligning the pusher 80 with the socket 60. Further, the base 93 is in contact with the stopper 69 on an edge part of the socket guide 66, thereby defining an interval between the pusher 80 and the socket 60. In an embodiment, the base 93 protrudes about 12.6 mm from an edge portion of the lower housing 92.

The upper housing 94 covers the rotary pusher block 100 combined with a center part of the lower housing 92. Here, the upper housing 94 is provided to cover rest tips, for example, rest tips shown in FIGS. 4A to 4C, except a corresponding tip of the rotary pusher block 100 contacting the semiconductor package 52.

Figure 4A:
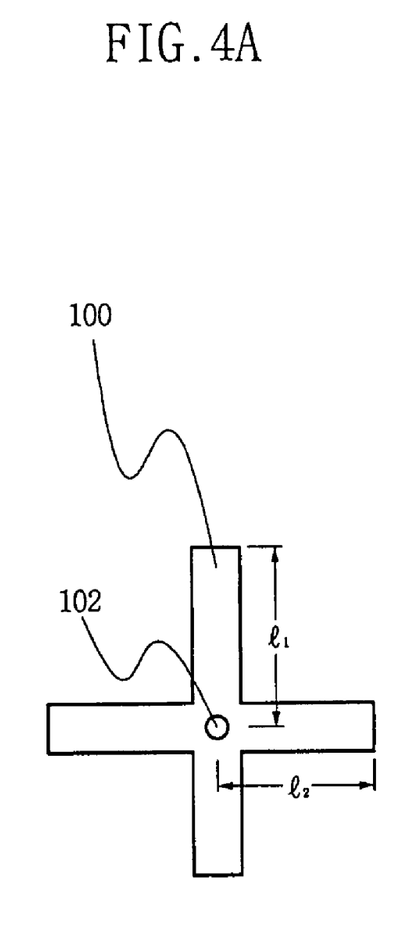
FIGS. 4A to 4C are plan views illustrating examples of a rotary pusher block shown in FIG. 3 according to embodiments of the invention.
Figure 4B:
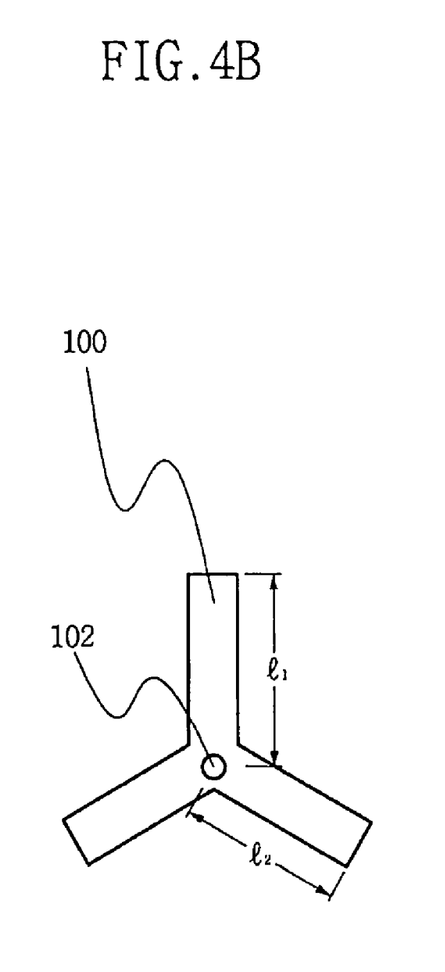
Figure 4C:
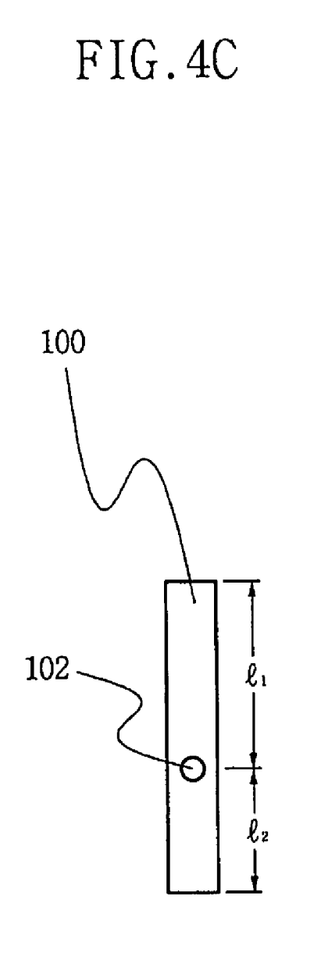

In embodiments, the rotary pusher block 100 may be provided as a cross (+) shape formed of a plurality of tips, for example, four tips, a Y-shape formed of three tips, or a straight (l) shape, illustrated in FIGS. 4A to 4C, respectively. In embodiments, the tips of the cross-shape, Y-shape, and straight-shape rotary pusher blocks 100 each have mutually different levels. In embodiments, at least one first tip has a first length $l_1$ and at least one second tip has a second length $l_2$, wherein the first and second lengths $l_1$, $l_2$ are different lengths.

The rotary pusher block 100 is attached to the pusher 80, and pierces, or extends through, a center of, the lower housing 92, wherein a tip protrudes about 15 mm from a lower face of the lower housing 92. The semiconductor package 52 having a thickness of about 1.0 mm may be compressed by a predetermined contact stroke distance. For example, to compress the semiconductor package 52 having a thickness of 0.9 mm as a contact stroke distance of about 0.25 mm, the rotary pusher block 100 must be positioned so that a tip of about 15.1 mm pierces a lower face of the lower housing 92. On the other hand, to compress the semiconductor package 52 having a thickness of 1.1 mm as a contact stroke distance of about 0.25 mm, a tip of about 14.9 mm must be positioned to pierce through a lower face of the lower housing 92. The cross shape rotary pusher block 100 can compress four mutually different semiconductor packages 52 onto the socket 60 in a given contact stroke distance. The Y-shape rotary pusher block 100 can compress semiconductor packages 52 having three different thicknesses. The straight shape rotary pusher block 100 can compress the semiconductor packages 52 having two different thicknesses.

Therefore, in a semiconductor package testing apparatus according to an embodiment of the invention, an electrical characteristic test of semiconductor packages with various kinds of thickness can be performed by using the multilevel pusher 80 compressing the semiconductor package 52 by a given pressure force according to a thickness of semiconductor package, thereby increasing productivity.

Figure 5:
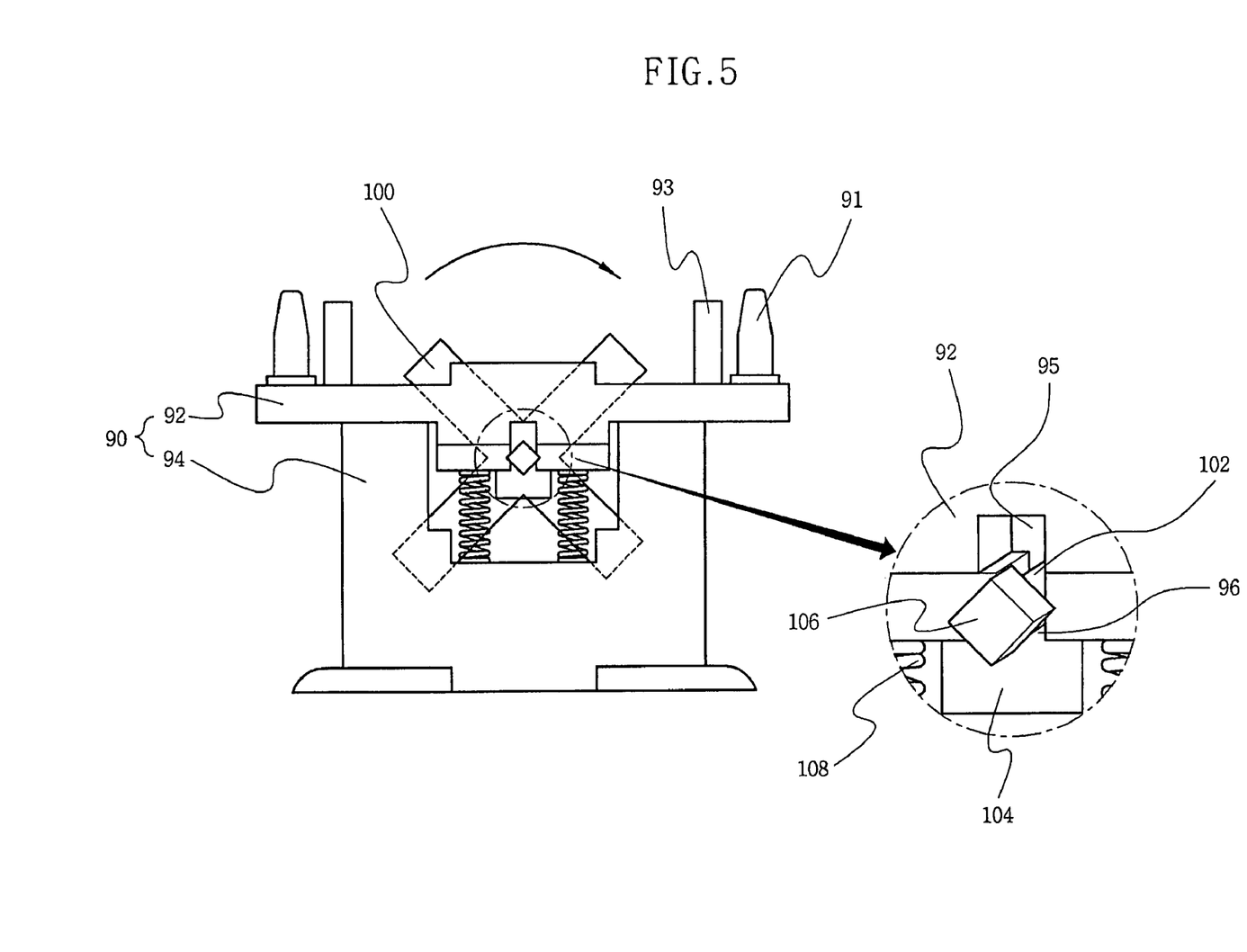
FIG. 5 is a perspective view illustrating in detail the rotation of the rotary pusher block shown in FIG. 3 according to embodiments of the invention.

FIG. 5 is a perspective view illustrating in detail a rotation of the rotary pusher block 100 shown in FIG. 3, according to embodiments of the invention.

As shown in FIG. 5, the rotary pusher block 100 may rotate on a rotary axis 102 piercing a center of a plurality of tips. The rotary axis 102 is adapted to rotate within a fixation hole 95 and a rotation hole 96 formed in the lower housing 92 approximate to the upper housing 94. Here, the rotary axis 102 is supported by a rotation supporter 104 between the lower and upper housings 92 and 94. For example, the rotation supporter 104 closely adheres to the lower housing 92 by a spring 108 having a given elasticity within the upper housing 94. Here, a plurality of springs 108 are manufactured to support an opposite side of the rotation supporter 104 opposing to the rotary axis 102 and simultaneously have a given level of elasticity. The plurality of springs 108 can protect the socket terminal 62 of the socket 60 from being damaged when the plurality of springs 108 excessively compress the semiconductor package 52.

Thus, the rotation supporter 104 closely adheres to the lower housing 92 by a given elasticity of the spring 108, and supporting the rotary axis 102 rotating within the rotary hole 96 of the lower housing 92. The fixation hole 95 is formed with a given shape to fix the rotation of the rotary axis 102, and the rotation hole 96 is formed larger than the fixation hole 95, so that the rotary axis 102 rotates therein.

Further, various shapes of rotation systems 106 are adapted in an end part of the rotary axis 102, to rotate in a given degree the rotation pusher block 100. The rotation system 106 is formed with a flat face that is parallel to a tip of the rotary pusher block 100. For example, in an end part of the rotary axis 102 for rotating the rotary pusher block 100 of a cross shape, rotation system 106 formed in a hexahedron having a square-shape sectional face.

In an embodiment, rotation system 106 formed in a pentahedron having a triangle-shape sectional face is adapted in an end part of the rotary axis 102 for rotating the Y-shape rotary pusher block 100, and rotation system 106 formed in a hexahedron having a sectional face of rectangular shape is formed in an end part of the rotary axis 102 rotating the rotary pusher block 100.

The rotation system 106 and the fixation hole 95 are formed having a same or similar size and shape. This is why when a corresponding tip selectively exposed through the lower housing 92 and a rotation of the rotary pusher block 100 is stopped, the rotation system 106 is inserted into the fixation hole 95, thereby fixing the rotary axis 102 in place.

For example, the rotation system 106 is protruded outward with regard to the fixation hole 95, and so the rotary axis 102 can be moved into the rotation hole 96 by a worker. Further the rotary axis 102 completed in a rotation in the rotation hole 96 is adapted to move into the fixation hole 95. When the rotation system 106 is positioned in the rotation hole 96, the rotation system 106 is inserted into the fixation hole 95 by a worker, thus fixing in place the rotary axis 102 and the rotary pusher block 100.

Accordingly, a semiconductor package testing apparatus according to an embodiment of the invention can solve a limitation in an electrical test of conventional single semiconductor package 52 by using a multilevel pusher 80 capable of compressing the semiconductor packages 52 having various kinds of thickness, that is, an electrical test applied to various kinds of semiconductor packages 52 can be performed, increasing productivity.

While the present invention has been particularly shown and described with reference to exemplary embodiments thereof, it will be understood by those of ordinary skill in the art that various changes in form and details may be made therein without departing from the spirit and scope of the present invention as defined by the following claims. In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor package testing apparatus comprising:
    a test substrate that electrically tests a semiconductor package chip;
    a socket having an electrical contact between the test substrate and the semiconductor package;
    an insert block inserted into the socket, wherein the semiconductor package is mounted to the insert block; and
    a pusher that brings the socket into contact with the semiconductor package by compressing an upper part of the semiconductor package, wherein the pusher is multilevel-controlled to compress the semiconductor package by a predefined pressure according to a thickness of the semiconductor package,
    wherein the pusher comprises a housing having a predefined internal space, and a rotary pusher block having a plurality of tips that compress a corresponding semiconductor package by using the tips, wherein the tips have different levels according to a thickness of the semiconductor package.

2. The apparatus of claim 1, wherein the housing comprises a lower housing through which any one of a plurality of tips of the rotary pusher block pierces, and an upper housing adapted covering the rotary pusher block in an upper part of the lower housing.

3. The apparatus of claim 2, wherein the lower housing comprises a base defining a lowered distance of the pusher in an edge portion thereof, and a guide pin adapted to align the socket and the insert block.

4. The apparatus of claim 1, wherein the rotary pusher block has a cross shape comprising four tips, each tip having a different level according to a thickness of semiconductor package inserted into the insert block.

5. The apparatus of claim 1, wherein the rotary pusher block has a Y-shape comprising three tips, each tip having a different level according to a thickness of semiconductor package inserted into the insert block.

6. The apparatus of claim 1, wherein the rotary pusher block has a straight shape comprising two tips, each tip having a different level according to a thickness of semiconductor package inserted into the insert block.

7. The apparatus of claim 1, wherein the pusher further comprises a rotary axis extending through a center of the housing, that rotates the rotary pusher block, and a rotation supporter for supporting the rotary axis.

8. The apparatus of claim 7, further comprising a plurality of springs that provide elasticity to the rotation supporter inside the housing.

9. The apparatus of claim 7, wherein the housing comprises a fixation hole that stops a rotation of the rotary axis while the rotary axis passes through the fixation hole, and further comprises a rotation hole larger than the fixation hole so that the rotary axis can rotate therein.

10. The apparatus of claim 7, wherein the rotary axis is provided with a rotation system formed at an end part thereof.

11. The apparatus according to any one of claim 10, wherein the rotation system and the fixation hole have a same or similar shape and size so as to be fastened to each other.

12. A multilevel pusher comprising:
a housing comprising a lower housing and an upper housing having a predefined internal space;
a rotary axis that extends through a hole in a center of the housing; and
a rotary pusher block about the rotary axis, and comprising a plurality of tips, each tip having a length relative to the rotary axis that is different with respect to a length of at least one of the other tips of the rotary pusher block, wherein a tip of the plurality of tips is selectable by rotating the rotary pusher block about the rotary axis within the housing, the selectable tip being exposed to the outside of the lower housing.

13. The multilevel pusher of claim 12, further comprising a rotation supporter that supports the rotary axis on one side of the hole in the center of the housing, and a spring that provides elasticity in the rotation supporter opposite the rotary axis.

14. The multilevel pusher of claim 12, wherein the rotary pusher block has a cross shape comprising four tips, each tip having a different level according to a thickness of semiconductor package inserted into the insert block.

15. The multilevel pusher of claim 14, wherein the rotary axis for rotating the rotary pusher block having the cross shape is coupled to a rotation system that is at an end part of the rotary axis, the rotation system formed in a hexahedron having a square-shape sectional face.

16. The multilevel pusher of claim 12, wherein the rotary pusher block has a Y-shape comprising three tips, each tip having a different level according to a thickness of the semiconductor package inserted into the insert block.

17. The multilevel pusher of claim 16, wherein the rotary axis for rotating the rotary pusher block having the Y-shape is coupled to a rotation system that is at an end part of the rotary axis, the rotation system formed in a pentahedron having a triangle-shape sectional face.

18. The multilevel pusher of claim 12, wherein the rotary pusher block has a straight-shape comprising two tips, each tip having a different level according to a thickness of the semiconductor package inserted into the insert block.

19. The multilevel pusher of claim 18, wherein the rotary axis for rotating the rotary pusher block having the straight-shape is coupled to a rotation system that is at an end part of the rotary axis, the rotation system formed in a hexahedron having a rectangular-shape sectional face.

* * * * *